United States Patent
Katscher et al.

(10) Patent No.: US 7,176,686 B2
(45) Date of Patent: Feb. 13, 2007

(54) PARALLEL MR IMAGING METHOD

(75) Inventors: Ulrich Katscher, Norderstedt (DE); Peter Boernert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 275 days.

(21) Appl. No.: 10/498,594

(22) PCT Filed: Dec. 19, 2002

(86) PCT No.: PCT/IB02/05653
§ 371 (c)(1),
(2), (4) Date: Jun. 10, 2004

(87) PCT Pub. No.: WO03/056352
PCT Pub. Date: Jul. 10, 2003

(65) Prior Publication Data
US 2005/0131290 A1    Jun. 16, 2005

(30) Foreign Application Priority Data
Dec. 22, 2001 (DE) ............................... 101 63 815

(51) Int. Cl.
*G01V 3/00* (2006.01)
(52) U.S. Cl. .................................... 324/309
(58) Field of Classification Search ................. 324/309
See application file for complete search history.

(56) References Cited

U.S. PATENT DOCUMENTS 5,390,258 A * 2/1995 Levin .......................... 382/131
5,438,263 A    8/1995 Dworkin et al.
5,910,728 A * 6/1999 Sodickson .................. 324/309

(Continued)

FOREIGN PATENT DOCUMENTS

WO    WO 99/54746    10/1999

(Continued)

OTHER PUBLICATIONS

Jakob et al. "Auto-Smash: A self-calibrating technique for SMASH imaging", Magnetic Resonance Materials in Physics, Biology and Medicine, 7 (1998), p. 42-54.*
Hoge et al., "A doubly adaptive approach to dynamic MRI sequence estimation", IEEE Transactions on Image Processing, vol. 11, No. 11, (2002), p. 1168-1178.*

(Continued)

*Primary Examiner*—Louis M. Arana
(74) *Attorney, Agent, or Firm*—Fay, Sharpe, Fagan, Minich & McKee LLP

(57) ABSTRACT

The invention relates to a parallel MR imaging method in which first a first MR imaging sequence is formed with a selectable minimum number of phase encoding steps and at least two separate MR signal data sets are acquired by means of at least two MR receiving coils. A first MR image is reconstructed from this data while taking into account the spatial sensitivity profiles of the MR receiving coils. In order to improve parallel MR imaging methods of this kind, the invention proposes to evaluate the quality of the reconstructed MR image in a subsequent step of the method and, in dependence upon the result of the evaluation, to either terminate the imaging method or to form a further MR imaging sequence with a number of further phase encoding steps. This procedure can be continued until an adequate MR image quality is reached.

14 Claims, 2 Drawing Sheets

U.S. PATENT DOCUMENTS 6,127,826 A * 10/2000 Thompson et al. ......... 324/307
6,242,916 B1    6/2001 King
6,281,681 B1 *  8/2001 Cline et al. ................. 324/310
6,425,864 B1 *  7/2002 Foo et al. ................... 600/420

FOREIGN PATENT DOCUMENTS

WO    WO 00/31559    6/2000

OTHER PUBLICATIONS

Pruessmann, et al.; SENSE: Sensitivity Encoding for Fast MRI; Magnetic Resonance in Medicine; vol. 42, 1999, pp. 952-962.

Sodickson, et al.; Simultaneous Acquisition of Spatial Harmonics (SMASH): Fast Imaging with Radiofrequency Coil Arrays; Magnetic Resonance in Medicine, vol. 38, 1997 pp. 591.

Kyriakos, et al.; Sensitivity Profiles, Magnetic Resonance in Medicine, vol. 44, 2000, pp. 301-308.

* cited by examiner

PARALLEL MR IMAGING METHOD

BACKGROUND

The invention relates to an MR imaging method for forming an image of the nuclear magnetization distribution in an examination zone (FOV), which method includes the following steps:
a) forming a first MR imaging sequence with a selectable minimum number of phase encoding steps,
b) measuring at least two separate MR signal data sets by means of at least two MR receiving coils,
c) reconstructing a first MR image by Fourier transformation and combination of the separate MR signal data sets while taking into account the respective spatial sensitivity profiles of the MR receiving coils.

The invention also relates to an MR apparatus for carrying out the method as well as to a computer program for controlling an MR apparatus.

It is known that magnetic resonance tomography is a spectral imaging method in which the nuclear magnetization is localized on the basis of the respective associated resonant frequency of the spins by using a spatially inhomogeneous magnetic field (magnetic field gradients). For imaging it is common practice to acquire the magnetic resonance signal in the time domain as a voltage, induced in a coil surrounding the examination zone, under the influence of a suitable sequence of RF pulses and gradient pulses. The actual image reconstruction is then performed by Fourier transformation of the time signals. The number, the distance in time, the duration and the strength of the gradient pulses used govern the scanning of the reciprocal so-called k space which determines the examination zone to be imaged (FOV or field of view) as well as the image resolution. A customary pulse sequence as used for the sequential scanning of the k space is, for example, the EPI (echo planar imaging) sequence. Requirements imposed on the image format and the image resolution govern the number of phase encoding steps and hence the duration of the imaging sequence. This is a direct cause of one of the essential drawbacks of magnetic resonance tomography, because the acquisition of an image of the complete examination zone with a resolution which suffices for diagnostic purposes usually takes an undesirably long period of time.

A large number of technical developments in the field of magnetic resonance tomography aim to achieve a drastic reduction of the image acquisition times. Further hardware developments, enabling as fast as possible switching of the magnetic field gradients, have met the limits of technical feasibility and the limits of what can be physiologically tolerated for a patient. However, for a number of applications, notably also for interventional radiology, the acquisition times are still too long.

The recent advent of parallel MR imaging methods such as, for example, the SMASH technique (Simultaneous Acquisition of Spatial Harmonics, see Sodickson et al., Magn. Reson. Med. 38, 591, 1997) or the SENSE technique (Sensitivity Encoding, see Pruessmann et al., Magn. Reson. Med. 42, 952, 1999) seems to enable a shift of the existing technical and physiological speed limits of conventional Fourier imaging. Such techniques are based on the recognition of the fact that the spatial sensitivity profile of the receiving coils impresses on the magnetic resonance signal position information which can be used for the image reconstruction. The parallel use of a plurality of separate receiving coils, each having a different spatial sensitivity profile, enables, by combination of the respective magnetic resonance signals detected, the acquisition time for an image to be reduced, in comparison with the conventional Fourier image reconstruction, by a factor which in normal cases is equal to the number of receiving coils used.

An MR imaging method of the kind set forth is disclosed, for example, in WO 99/54746. According to this known method, first a plurality of MR signal data sets is acquired while utilizing a plurality of receiving coils, an as small as possible number of phase encoding steps is then chosen so as to achieve a high image acquisition rate by scanning the k space only partly. The sensitivity of each of the receiving coils is dependent essentially on the distance between the nuclear magnetization to be detected and the relevant coil as well as on the geometry of the coil and on other factors such as, for example, the condition of the body of the patient to be examined. The spatial sensitivity profiles are used upon combination of the individual image data sets so as to reconstruct an image of the nuclear magnetization distribution in the examination zone while compensating for the inadequate scanning of the k space.

The known parallel MR imaging methods, however, have a drawback in that the signal-to-noise ratio of the reconstructed images, being approximately proportional to the square root of the image acquisition time in conventional non-parallel MR imaging techniques, is comparatively poor because of the fast measurement carried out by means of only a small number of phase encoding steps. The signal-to-noise ratio, moreover, may also be degraded by the respective position and geometry of the MR receiving coils used. In parallel MR imaging methods the inherently low sensitivity of magnetic resonance methods, therefore, does not enable a realistic reduction of the image acquisition time by more than a given measure while still maintaining an image quality which is acceptable for diagnostic purposes.

Recently MR imaging methods have become known which enable images to be reconstructed from MR signal data sets acquired in parallel, the phase encoding steps being selectable practically at random (see Kyriakos et al., Magn. Reson. Med. 44, 301, 2000). These known methods, however, also involve the problem that the image quality obtained is dependent to a high degree on the scanning of the k space and hence on the choice and the number of phase encoding steps. It appears from the cited article by Kyriakos et al. that it is difficult and intricate to specify, already before the beginning of the actual image acquisition, a suitable set of phase encoding steps whereby an optimum compromise of measuring time and image quality is achieved for the relevant measuring situation. The ideal parameters of the MR imaging sequence become apparent only from a series of test measurements. In real medical measuring situations, however, for lack of time, it is usually not possible to spend much time on optimizing the parameters of the imaging sequence prior to the actual image acquisition. Therefore, for real medical applications the known parallel MR imaging methods are of limited practical use only since the advantage of a gain in as achieved by the parallel data acquisition is lost again due to the time-consuming determination of the ideal phase encoding steps.

Based on the described state of the art, it is an object of the present invention to provide an improved parallel MR imaging method which eliminates said drawbacks and can be readily carried out by customary MR apparatus while requiring few adaptations only.

SUMMARY

On the basis of an MR imaging method of the kind set forth this object is achieved in that
d) the quality of the reconstructed MR image is evaluated and, in dependence on the evaluation result, either the imaging method is terminated or
e) a further MR imaging sequence is formed with a number of further phase encoding steps,
f) separate MR additional signals are measured by means of the MR receiving coils and added to the respective MR signal data sets, and
g) a further MR image is reconstructed by Fourier transformation and combination of the MR signal data sets modified in the step f) while taking into account the respective spatial sensitivity profiles of the MR receiving coils.

In the step a) the method in accordance with the invention commences by first forming a first imaging sequence for which a minimum number of phase encoding steps is specified, which number may be chosen in such a manner that a very fast measurement takes place but the image quality to be expected is not yet adequate because of the merely partial scanning of the k space. A known sequence such as, for example, an EPI sequence or an FSE sequence is a suitable imaging sequence in this respect. During the step b) of the method two or more separate MR signal data sets are then acquired in parallel, different MR receiving coils being used for each data set. The MR data thus acquired is used in the step c) to reconstruct a first MR image, exactly as in the known parallel MR imaging methods, by Fourier transformation and combination while taking into account the spatial sensitivity profiles of the relevant MR receiving coils. The image reconstruction requires exact knowledge of the spatial sensitivity profiles of the MR receiving coils. This data can be acquired in known manner by way of a one-time reference measurement. The reconstructed first MR image may have an inadequate image quality because of the only partial scanning of the k space which results from the choice of the minimum number of phase encoding steps in the step a) of the method. This image quality is evaluated next in the step d) of the method. If the signal-to-noise ratio of the MR image is too low or if the image contains undesirable image artifacts (for example, so-called "ghosts"), the method in accordance with the invention continues with the step e). However, if the image quality evaluated in the step d) of the method is already sufficient, the method is terminated. In the step e) a further imaging sequence is formed with at least one further phase encoding step, said sequence supplementing the scanning of the k space. The further phase encoding steps in the step e) of the method must be distinct from the phase encoding steps of the first MR imaging sequence. In the step f) separate MR additional signals are then measured by means of the MR receiving coils so as to be added to the relevant MR signal data sets. The MR signal data sets thus expanded by means of additional phase encoding steps, that is, the modified MR signal data sets, are then processed in the step g) so as to form a further MR image having an image quality which has been enhanced in comparison with the first MR image formed in the step c).

The main advantage of the method in accordance with the invention is due to the fact that the scanning of the k space is successively supplemented by way of the further phase encoding steps in the step e). The imaging is then terminated as soon as the quality of the MR image reconstructed during the image acquisition becomes adequate. As opposed to the methods which are known from the state of the art, it is now no longer necessary to know, that is, already before the image acquisition, the set of phase encoding steps required so as to achieve an optimum image quality in combination with a minimum measuring time. The method in accordance with the invention is adapted dynamically to a given extent to the relevant measuring situation, it being ensured that the image acquisition time is always minimum, because preceding test measurements are no longer necessary and each MR signal measured is evaluated.

It is also advantageously possible to choose the further phase encoding steps in the step e) of the method in dependence on the evaluation result of the step d). Using a suitable algorithm, for example, the signal-to-noise ratio or the resolution of the MR image can be determined or image artifacts can be recognized, after which the further phase encoding steps are chosen in such a manner that the respective detected imperfections of the MR image are eliminated as effectively as possible by the supplementary scanning of the k space.

An advantageous further version of the method in accordance with the invention consists in that the steps d) to g) of the method are repeated until the quality of the MR image is evaluated as being adequate in the step d) of the method. The scanning of the k space is thus iteratively supplemented by way of further phase encoding steps until the quality of the respective MR image reconstructed in the step g) of the method is satisfactory.

In conformity with the method of the invention it is possible to display the MR image reconstructed each time as the last one in the step c) or g) of the method on a monitor, the evaluation of the quality of the reconstructed MR image in the step d) of the method being carried out by a user who decides whether the imaging method is terminated or continued with the steps e) to g) of the method. Such an interaction with the user, however, makes sense only if the overall measuring time during the image acquisition is significantly longer than the period of time required by the user so as to evaluate the image quality. This procedure, however, also has advantages because the automatic assessment of the image quality by means of a suitable algorithm and the definition of suitable interrupt criteria are difficult from a technical point of view. Particularly in the medical diagnostic field, moreover, ultimately the subjective impression formed by the physician carrying out the examination is decisive.

On the other hand, automatic evaluation of the image quality can take place in the step d) of the method by calculating a difference image between the last two reconstructed MR images, the imaging method being terminated when the intensity of the difference image is below a selectable threshold value. The iterative imaging method is thus interrupted as soon as adequate convergence is detected.

Preferably, the minimum number of phase encoding steps chosen in the step a) of the method in accordance with the invention is such that the examination zone is only partly scanned by the MR imaging sequence. This enables a minimum image acquisition time to be achieved. It is known that image reconstruction with an acceptable image quality may also be possible in parallel MR imaging methods when only very small parts of the k space are scanned (see Katscher et al., Proceedings of the ISMRM—Workshop "Minimal Data Acquisition", 2001, 42). In conformity therewith, in comparison with conventional, non-parallel imaging methods the acquisition time for an MR image can in given circumstances be reduced a factor which is significantly larger than the number of receiving coils used.

A sensible further version of the MR imaging method in accordance with the invention involves an additional interrupt criterion which ensures that the method is also terminated when overall a maximum number of phase encoding steps is reached at which the scanning of the k space of the examination zone is complete. This is because in that case no further improvement of the image quality is to be expected and further iterations would merely mean a waste of valuable measuring time.

A particularly effective successive expansion of the scanning of the k space is possible in the method in accordance with the invention in particular when the phase encoding steps of the MR imaging sequences formed in the steps a) and e) of the method are not equidistant. In that case a method in conformity with the cited article by Kyriakos et al. can be used for the image reconstruction.

In conformity with the method of the invention, the image reconstruction in the steps c) and g) of the method can also be performed by means of the SENSE method or the SMASH method. These methods are extensively disclosed in literature and have proven their worth in practice.

An MR apparatus as disclosed in claim 9 is suitable for carrying out the MR imaging method in accordance with the invention. The implementation on an MR tomography apparatus in clinical use is thus simply possible. It is merely necessary to adapt the programming of the reconstruction unit or the control unit. This can be realized by means of a computer program for controlling an MR apparatus as disclosed in claim 10. A computer program of this kind can be advantageously made available to the users of MR apparatus on a suitable data carrier, such as a disc or a CD-ROM, or by downloading via a data network (the Internet).

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
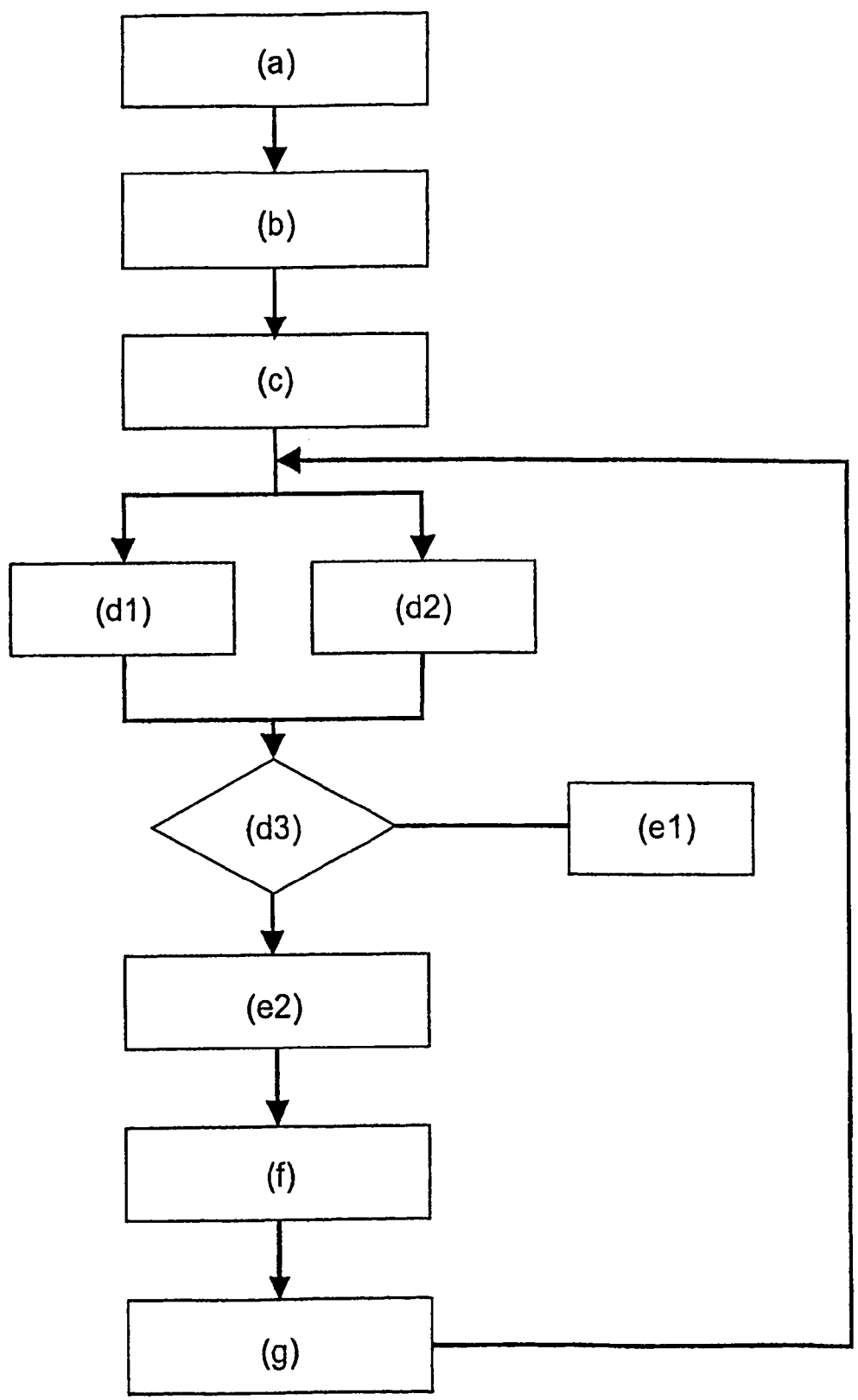
FIG. 1 shows a flow chart of the MR imaging method in accordance with the invention.

The method shown in FIG. 1 commences with a step (a) in which a first MR imaging sequence is generated. For example, an EPI sequence with a minimum number of phase encoding steps is applied, the examination zone or the so-called field of view, being only incompletely scanned thereby.

In the step (b) of the method the nuclear magnetization generated in the examination zone by the MR imaging sequence is detected by means of two MR surface coils and stored in the form of two separate MR signal data sets.

Subsequently, a first MR image is formed from this data in the step (c) of the method. To this end, the two data sets are first Fourier transformed in the frequency encoding direction, after which they are combined, for example, in conformity with the method proposed by Kyriakos et al. and while taking into account the spatial sensitivity profiles of the MR surface coils used, so as to form the finished MR image. The sensitivity profiles required for the image reconstruction are determined prior to the actual imaging procedure, for example, by comparing reference images acquired by means of the MR surface coils with images acquired by means of a body coil. This reference measurement can be carried out within a very short period of time, because low-resolution reference images suffice for the determination of the sensitivity data.

Subsequently, the quality of the reconstructed image is evaluated. This operation may take place in the step (d1) of the method in which the MR image is displayed on a monitor and the evaluation of the image quality is carried out by a physician who performs the examination and decides whether the imaging procedure is to be terminated or continued. Alternatively, the evaluation of the image quality can take place in the step (d2) of the method in which a suitable image processing algorithm is applied for this purpose. Using the algorithm, for example, the image noise and/or the image resolution can be determined. Moreover, characteristic image artifacts, caused by the inadequate scanning of the k space by means of the imaging sequence in conformity with the step (a) of the method, can be automatically detected in the reconstructed MR image. The algorithm can also be used to evaluate the convergence of the procedure, for example, by calculating the intensity difference between the last two reconstructed MR images.

In the step (d3) of the method, in dependence on the result of the evaluation either the imaging procedure is terminated by way of the step (e1) of the method or the imaging procedure is continued in the step (e2) of the method with a further MR imaging sequence whereby the scanning of the k space becomes complete. The nuclear magnetization generated by the further MR imaging sequence is detected and recorded by means of the two MR surface coils in the step (f) of the method. The two separate MR signal data sets previously stored in the step (b) are then supplemented with this data.

Subsequently, the procedure continues with the step (g) of the method, the modified signal data sets being used to reconstruct a new (second) MR image in the described manner (see step (c)). Overall, the procedure with the steps (d1) or (d2) to (g) of the method is continued until the image quality is assessed to be satisfactory in the step (d3).

Figure 2:
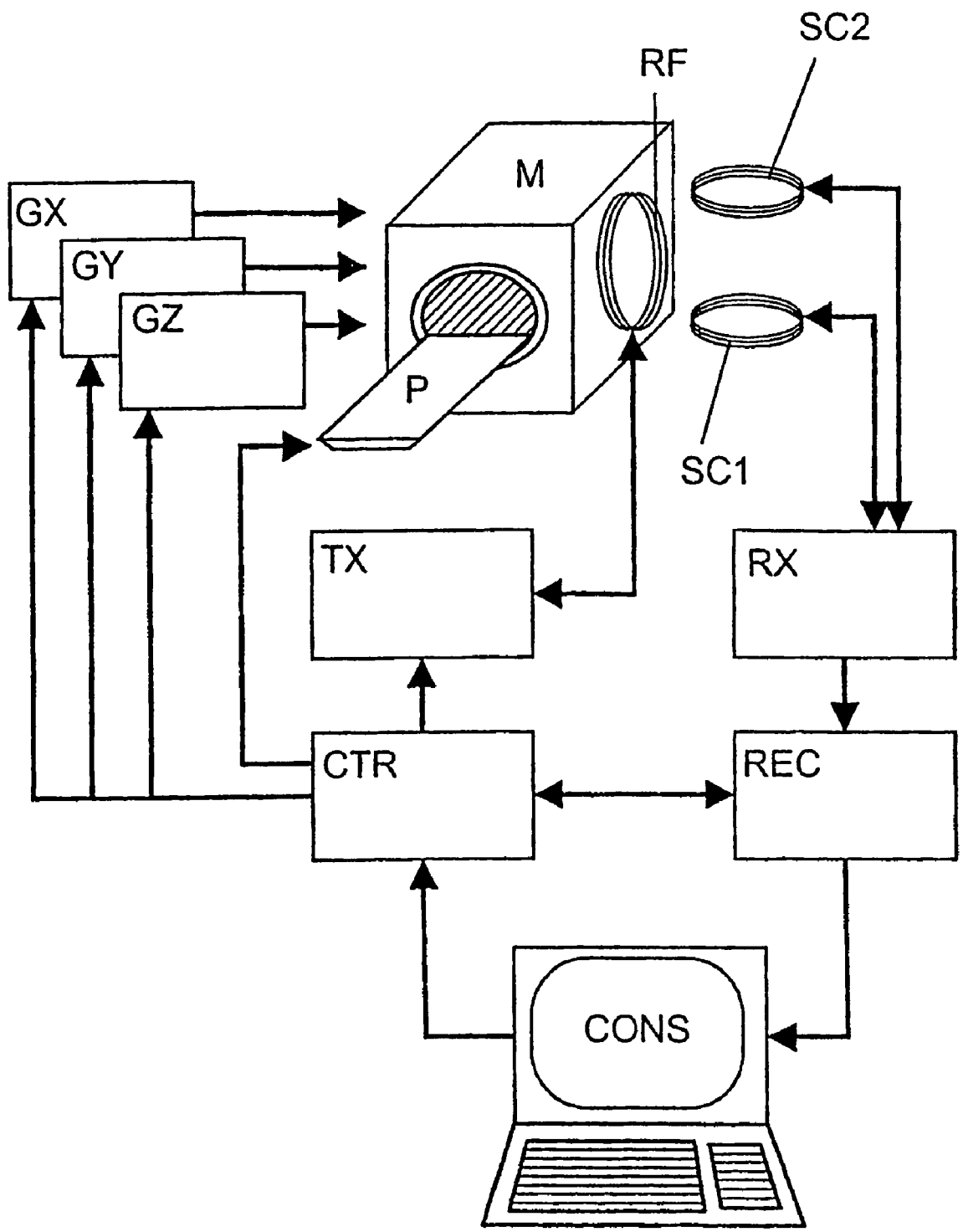
FIG. 2 shows an MR apparatus in accordance with the invention.

FIG. 2 is a diagrammatic representation of an MR apparatus which is suitable for carrying out the method in accordance with the invention. The core of the apparatus is formed by a main magnet M which generates an essentially uniform, steady magnetic field with a flux density of, for example, 1.5 Tesla in an examination zone. The magnet M is customarily a superconducting electromagnet. A patient table P on which a patient is accommodated during an examination can be moved into the magnet M. The field direction of the magnet M extends parallel to the longitudinal direction of the patient table P.

There is also provided a system of gradient coils GX, GY, GZ which receive a current via gradient amplifiers (not shown). The gradient pulses required for the various MR imaging sequences can thus be generated in arbitrary directions in space in the examination zone.

An RF coil system RF serves to apply RF pulses to the examination zone. To this end, the RF coil system RF is connected to an RF power transmitter TX. The transmitter TX is controlled by a control unit CTR which also controls the gradient coils GX, GY, GZ in order to generate the necessary sequences. Moreover, the position of the patient table P is changed by way of the control unit CTR.

A reconstruction unit REC digitizes and stores the MR signals supplied by a receiver RX and reconstructs images of the nuclear magnetization distribution in the examination zone therefrom in conformity with the invention. The receiver RX serves to record the separate MR signals acquired by means of two surface coils SC1 and SC2. The two surface coils SC1 and SC2 have spatial sensitivity profiles which strongly deviate from one another; this is beneficial to the parallel MR imaging method in accordance with the invention. The reconstruction unit REC stores the sensitivity data of the two surface coils SC1 and SC2. This data may be acquired, for example, as described above, in the course of a reference measurement.

In order to carry out the method in accordance with the invention, the reconstruction unit REC and the control unit CTR are programmed in such a manner that during the imaging procedure in accordance with the invention MR images can be continuously reconstructed from the separate MR signal data sets acquired by means of the surface coils SC1 and SC2 and that, in dependence on the image quality achieved, further MR imaging sequences with supplementary phase encoding steps can be iteratively generated so as to achieve an optimum compromise between image acquisition time and image quality.

The reconstruction unit REC is also connected to a control console CONS which includes a monitor on which the reconstructed image data is displayed. The console CONS at the same time serves to control the complete system and to initiate the desired MR imaging sequences. To this end, the console CONS is also connected to the control unit CTR. An additional connection exists between the control unit CTR and the reconstruction unit REC. This connection is necessary to communicate the phase encoding used during the acquisition between the control unit CTR and the reconstruction unit REC.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An MR imaging method for forming an image of the nuclear magnetization distribution in an examination zone, which method includes the steps of:
   a) applying a first MR imaging sequence with a selectable minimum number of phase encoding steps,
   b) acquiring at least two separate MR signal data sets by means of at least two MR receiving coils,
   c) reconstructing a first MR image by Fourier transformation and combination of the separate MR signal data sets while taking into account the respective spatial sensitivity profiles of the MR receiving coils,
   d) evaluating the reconstructed MR image and, in dependence on the evaluation result either: (i) terminating the ima in method or (ii) refining the image by:
   e) applying a further MR imaging sequence with a number of further phase encoding steps,
   f) acquiring at least two additional MR signal data sets by means of the MR receiving coils,
   g) reconstructing a further MR image by Fourier transformation and combination of the previously acquired and additional MR signal data sets while taking into account the respective spatial sensitivity profiles of the MR receiving coils,
   h) evaluating the further MR image, and
   i) repeating steps e) to h) as necessary until the quality of the further MR image is evaluated as being adequate in the step e) then terminating the method.

2. The MR imaging method as claimed in claim 1, wherein each MR image reconstructed in the step c) or g) is displayed on a monitor, the evaluation of the reconstructed MR image in the steps d) and h) being carried out by a user.

3. An MR imaging method as claimed in claim 1, wherein the evaluation of the MR image in the step h) is carried out by calculating a difference image between the last two reconstructed MR images, the imaging method being terminated when an intensity of the difference image is below a selectable threshold value.

4. An MR imaging method as claimed in claim 1, wherein the phase encoding steps of the MR imaging sequence of steps a) and e) of the method are not equidistant.

5. The MR imaging method as claimed in claim 4, wherein the image reconstruction in the steps c) and h) of the method is performed by SENSE method or a SMASH method.

6. An MR imaging apparatus comprising:
   a main magnet which generates a main magnetic field in the examination zone;
   a gradient coil system which generates magnetic field gradients across the examination zone;
   an RF coil system which generates RF fields in the examination zone;
   at least two MR receiving coils having different spatial sensitivity profiles for receiving MR signals from the examination zone;
   a reconstruction unit which reconstructs MR signal sets into MR images; and,
   a control unit which controls the gradient coil system, the RF coil system, the two MR receiving coils, and the reconstruction unit and including one or more processors programmed to perform the method of claim 1.

7. An MR apparatus including means for performing each of the steps of claim 1.

8. Computer software programmed to control an MR imaging apparatus to perform the method of claim 1.

9. An MR imaging method the minimum number of phase encoding steps being chosen for forming an image of the nuclear magnetization distribution in an examination zone, which method includes the steps of:
   a) forming a first MR imaging sequence with a selectable minimum number of phase encoding steps, such that the examination zone is only partly scanned by the MR imaging sequence,
   b) measuring at least two separate MR signal data sets by means of at least two MR receiving coils,
   c) reconstructing a first MR image by Fourier transformation and combination of the separate MR signal data sets while taking into account the respective spatial sensitivity profiles of the MR receiving coils,
   d) evaluating the quality of the reconstructed MR image and, in dependence on the evaluation result, either the imaging method is terminated or
   e) forming a further MR imaging sequence with a number of further phase encoding steps,
   f) measuring separate MR additional signals by means of the MR receiving coils and adding the respective MR signal data sets, and
   g) reconstructing a further MR image by Fourier transformation and combination of the MR signal data sets modified in the step f) of the method while taking into account the respective spatial sensitivity profiles of the MR receiving coils.

10. The MR imaging method as claimed in claim 9, wherein the imaging method is also terminated when overall a maximum number of phase encoding steps at which scanning of the examination zone is complete is reached.

11. An MR apparatus for carrying out the method claimed in claim 9, which apparatus includes a main magnet for generating a uniform magnetic field, a gradient coil system for generating magnetic field gradients, an RF coil for generating RF fields, at least two MR receiving coils having different spatial sensitivity profiles for the reception of MR signals, a control unit which controls the gradient coils and the RF coil, and also includes a reconstruction unit whereby MR signal data sets and spatial sensitivity data of the MR receiving coils are stored and processed, the control unit and the reconstruction unit being programmed in such a manner that
   a) a first MR imaging sequence with a selectable minimum number of phase encoding steps is formed by means of the gradient coils and the RF coil,
   b) at least two separate MR signal data sets are measured by means of the MR receiving coils,
   c) a first MR image is reconstructed, by means of the reconstruction unit, by Fourier transformation and combination of the separate MR signal data sets while taking into account the stored sensitivity data, where
   d) the quality of the reconstructed MR image is evaluated by means of the reconstruction unit and, in dependence on the evaluation result, either the imaging method is terminated or
   e) a further MR imaging sequence with a number of further phase encoding steps is formed by means of the gradient coils and the RF coil,
   f) separate MR additional signals are measured by means of the MR receiving coils and added to the respective MR signal data sets, and
   g) a further MR image is reconstructed, by means of the reconstruction unit, by Fourier transformation and combination of the MR signal data sets modified in the step f) of the method while taking into account the respective sensitivity data, the steps d) to g) of the method being repeated until the quality of the MR image is evaluated as being adequate in the step d) of the method.

12. A computer program for controlling an MR apparatus as claimed in claim 11, wherein the program controls the control unit and the reconstruction unit of the MR apparatus so as to carry out an imaging procedure in such a manner that
   a) a first MR imaging sequence with a selectable minimum number of phase encoding steps is formed,
   b) at least two MR signal data sets are measured by means of at least two MR receiving coils,
   c) a first MR image is reconstructed, by means of the reconstruction unit, by Fourier transformation and combination of the separate MR signal data sets while taking into account the spatial sensitivity profiles of the MR receiving coils, where
   d) the quality of the reconstructed MR image is evaluated by means of the reconstruction unit and, in dependence on the evaluation result, either the imaging procedure is terminated or
   e) a further MR imaging sequence with a number of further phase encoding steps is formed,
   f) separate MR additional signals are measured by means of the MR receiving coils and added to the respective MR signal data sets, and
   g) a further MR image is reconstructed, by means of the reconstruction unit, by Fourier transformation and combination of the MR signal data sets modified in the program step f) while taking into account the respective spatial sensitivity profiles, the steps d) to g) of the method being repeated until the quality of the MR image is evaluated as being adequate in the step d) of the method.

13. An MR apparatus including means for performing each of the steps of claim 9.

14. Computer software programmed to control an MR imaging apparatus to perform the method of claim 9.

* * * * *